United States Patent
Musuvathy et al.

(10) Patent No.: US 10,783,708 B2
(45) Date of Patent: Sep. 22, 2020

(54) SYSTEMS AND METHODS FOR DETERMINING MASS PROPERTIES OF A MODELED OBJECT

(71) Applicant: SIEMENS INDUSTRY SOFTWARE INC., Plano, TX (US)

(72) Inventors: Suraj Ravi Musuvathy, Princeton, NJ (US); George Allen, Shanghai (CN)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/468,550

(22) PCT Filed: Mar. 14, 2017

(86) PCT No.: PCT/CN2017/076581
§ 371 (c)(1),
(2) Date: Jun. 11, 2019

(87) PCT Pub. No.: WO2018/165842
PCT Pub. Date: Sep. 20, 2018

(65) Prior Publication Data
US 2020/0013216 A1    Jan. 9, 2020

(51) Int. Cl.
*G06T 17/20* (2006.01)
(52) U.S. Cl.
CPC .................. *G06T 17/20* (2013.01)
(58) Field of Classification Search
CPC ....................................................... G06T 17/20
See application file for complete search history.

(56) References Cited

U.S. PATENT DOCUMENTS 3,681,783 A * 8/1972 Christou ................. G06F 7/548
703/5
5,222,202 A * 6/1993 Koyamada .............. G06T 17/20
345/423

(Continued)

FOREIGN PATENT DOCUMENTS

| CN | 101436303 A | 5/2009 |
|---|---|---|
| CN | 102360084 A | 2/2012 |
| CN | 103942836 A | 7/2014 |

OTHER PUBLICATIONS

Ruprecht, D., & Müller, H. (1998). A scheme for edge-based adaptive tetrahedron subdivision. In Mathematical Visualization (pp. 61-70). Springer, Berlin, Heidelberg.*

(Continued)

*Primary Examiner* — Sarah Lhymn

(57) ABSTRACT

Methods for product design and corresponding systems and computer-readable mediums. A method includes receiving a modeled object having a surface and a non-homogeneous density distribution. The method includes tessellating the surface of the object into a set of triangles defined by triangle vertices. The method includes selecting a reference point for the object. The method includes, for each triangle in the tessellation, constructing a tetrahedron, the tetrahedron defined by tetrahedron vertices that include the vertices of the corresponding triangle and the reference point, determining a material density at each of the tetrahedron vertices, and computing mass properties for the tetrahedron using the material density at each of the tetrahedron vertices. The method includes aggregating the mass properties of the tetrahedrons. The method includes storing the aggregated mass properties of the tetrahedrons as the mass properties of the object.

15 Claims, 4 Drawing Sheets

(56) References Cited

U.S. PATENT DOCUMENTS

| | | | | |
|---|---|---|---|---|
| 6,275,233 B1* | 8/2001 | Gueziec | ............... | G06T 17/20 345/419 |
| 6,445,390 B1* | 9/2002 | Aftosmis | ............... | G06T 17/20 345/420 |
| 2004/0054304 A1* | 3/2004 | Raby | ............... | G06T 7/66 600/590 |
| 2004/0261501 A1 | 12/2004 | Ng-Thow-Hing | | |
| 2005/0021582 A1* | 1/2005 | Kallay | ............... | G06T 13/00 708/446 |
| 2005/0195185 A1* | 9/2005 | Slabaugh | ............... | G06K 9/00214 345/419 |
| 2011/0310101 A1* | 12/2011 | Prange | ............... | G01V 99/00 345/420 |

OTHER PUBLICATIONS

Mirtich, Brian; "Fast and Accurate Computation of Polyhedral Mass Properties", Journal of Graphics Tools, Dec. 31, 1996, No. 2, vol. 1, 15 pages.

Cools, Ronald; "An Encyclopaedia of Cubature Formulas", Dept. of Computer Science, Katholieke Universiteit Leuven, Celestijnenlaan 200 A, B-3001 Heverlee, Belgium, Jan. 15, 2003, 9 pages.

Eberly, David; "Polyhedral Mass Properties (revisited)", Geometric Tools, LLC, created Dec. 31, 2002, Last modified Nov. 3, 2009, 7 pages.

DiCarlo, Antonio; Fast Computation of Inertia Through Affinely Extended Euler Tensor, Universita "Roma Tre", Roma, Italy, Preprint submitted to Elsevier Science Apr. 20, 2006, 21 pages.

Lien, Sheue-Ling; "A Symbolic Method for Calculating the Integral Properties of Arbitrary Nonconvex Polyhedra", California Institute of Technology, Oct. 1984, 8 pages.

Yong Tsui Lee; "Algorithms for Computing the Volume and other Integral Properties of Solids. I. Known Methods and Open Issues", University of Rochester, Communications of the ACM, Sep. 1982, vol. 25, No. 9, 8 pages.

Yong Tsui Lee; "Algorithms for Computing the Volume and other Integral Properties of Solids.II. A Family of Algorithms Based on Representation Conversion and Cellular Approximation", University of Rochester, Communications of the ACM, Sep. 1982, vol. 25, No. 9, 10 pages.

Kallay, Michael, "Computing the Moment of Inertia of a Solid Defined by a Triangle Mesh", Journal of Graphics Tools, vol. 11, No. 2 (2006), 7 pages.

Eberly, David; "Polyhedral Mass Properties (revisited)", Geometric Tools, LLC, created Dec. 31, 2002, Last modified Nov. 3, 2009, 6 pages.

PCT Search Report dated Mar. 14, 2017, for PCT Application No. PCT/CN2017/076581, 11 Pages.

EP Search Report dated Mar. 18, 2020, for EP Application No. 17900949.3, 13 pages.

Sheue-Ling Lien et al: "A Symbolic Method for Calculating the Integral Properties of Arbitrary Nonconvex Polyhedra", IEEE Computer Graphics and Applications USA, vol. 4, No. 10, Oct. 1984 (Oct. 1984), 9 pages.

Anonymous: "Barycentric Coordinate System", 2016, Retrieved from the Internet: URL:https://web.archive.org/web/20161211161927/ https://en.wikipedia.org/wiki/Barycentric_coordinate_ system#Barycentric_coordinates_on_tetrahedra [retrieved on Mar. 5, 2020], 13 pages.

De Loera J A et al: "Software for Exact Integration of Polynomials Over Polyhedra", Computational Geometry: Theory and Applications Elsevier Science B.V. Netherlands, vol. 46, No. 3, Apr. 2013 (Apr. 2013), 22 pages.

Gosselin S et al: "Tetrahedral Mesh Generation Using Delaunay Refinement with Non-Standard Quality Measures", International Journal for Numerical Methods in Engineering Aug. 26, 2011 John Wiley and Sons LTD GBR, vol. 87, No. 8, Aug. 26, 2011 (Aug. 26, 2011), 27 pages.

Christiansen Asger Nyman et al: "Automatic Balancing of 30 Models", Computer Aided Design, Elsevier Publishers BV., Barking, GB, vol. 58, Aug. 19, 2014 (Aug. 19, 2014), 6 pages.

* cited by examiner

SYSTEMS AND METHODS FOR DETERMINING MASS PROPERTIES OF A MODELED OBJECT

RELATED APPLICATION

This patent document claims priority under 35 U.S.C. § 119 and all other benefits from PCT Application No. PCT/CN2017/076581, filed Mar. 14, 2017, the content of which is hereby incorporated by reference to the extent permitted by law.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems). In particular, embodiments are directed to systems and methods for computing mass properties of a modeled object having a nonhomogeneous material density distribution.

BACKGROUND OF THE DISCLOSURE

Mass properties, including mass (weight), center of mass, and moments of inertia are fundamental integral properties required for analyzing a digital model of an object and predicting the properties and performance of the final manufactured object. Determining such properties is difficult for modeled objects having a nonhomogeneous material density distribution, and improved systems are desirable.

SUMMARY OF THE DISCLOSURE

Various disclosed embodiments include systems and methods for determining mass properties of a modeled object, including, in particular, the mass properties of an object with a non-homogeneous material density distribution. A method includes receiving a modeled object having a surface and a non-homogeneous density distribution. The method includes tessellating the surface of the object into a set of triangles defined by triangle vertices. The method includes selecting a reference point for the object. The method includes, for each triangle in the tessellation, constructing a tetrahedron, the tetrahedron defined by tetrahedron vertices that include the vertices of the corresponding triangle and the reference point, determining a material density at each of the tetrahedron vertices, and computing mass properties for the tetrahedron using material density at each of the tetrahedron vertices. The method includes aggregating the mass properties of the tetrahedrons. The method includes storing the aggregated mass properties of the tetrahedrons as the mass properties of the object.

Various embodiments include splitting a tetrahedron that has a parameter that exceeds a predetermined threshold into multiple smaller tetrahedrons and using aggregated mass properties of the smaller tetrahedrons as the mass properties of the split tetrahedron. In various embodiments, the parameter is a length of an edge of the tetrahedron that connects two vertices as compared to a length threshold. In various embodiments, the parameter is a percentage difference between an average density of the tetrahedron and a density at a centroid of the tetrahedron as compared to a density threshold. In various embodiments, the data processing system splits the tetrahedron into eight smaller tetrahedrons along edges of the tetrahedron that connect tetrahedron vertices.

In various embodiments, the mass properties of the object include one or more of a volume of the object, a mass of the object, a center of mass of the object, and a moments and products of inertia of the object.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Mass properties, including mass (weight), center of mass, and moments of inertia are fundamental integral properties required for analyzing a digital model of an object. Today's design systems assume that an object is made of a solid or an assembly of solids with homogeneous material (i.e., constant material density), and so the mass property functions incorporate this assumption in the calculations. Additive manufacturing enables creating objects with graded or general varying materials across a solid object's volume.

Disclosed embodiments enable design systems to compute mass properties of objects with nonhomogeneous material densities in order to support design workflows geared towards additive manufacturing and other manufacturing processes that can realize such kinds of objects.

Disclosed embodiments include a novel approach to compute mass properties of an object with material density varying non-homogeneously across its volume. The approach extends the domain decomposition approach, such as described in "A Symbolic Method for Calculating the Integral Properties of Arbitrary Nonconvex Polyhedra," by Sheue-ling Lien and James T. Kajiya, since it is computationally superior compared to other approaches. Disclosed techniques use closed form expressions derived for mass properties of a tetrahedron with linearly varying material density. These expressions are used to compute the mass properties of the object, by recursively decomposing the object into a number of smaller tetrahedrons and aggregating their individual mass properties.

Disclosed techniques include computing an object's mass, center of mass, and moments of inertia. Other integral properties such as products of inertia and higher order moments that are useful for animation and numerical simulation, for example, can be computed in a similar manner.

Figure 1:
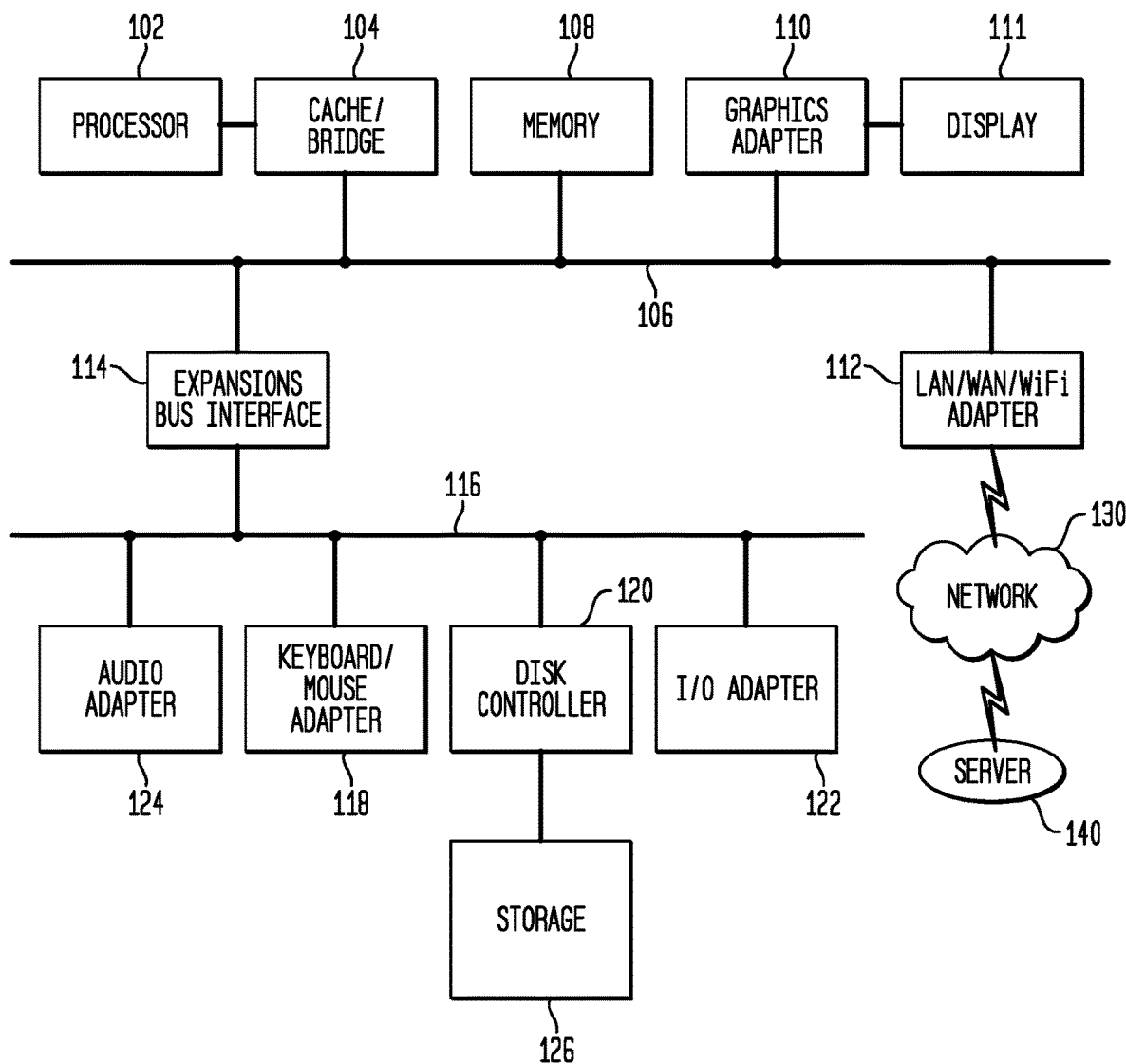
FIG. 1 illustrates a block diagram of a data processing system in which an embodiment can be implemented.

FIG. 1 illustrates a block diagram of a data processing system in which an embodiment can be implemented, for example as a CAD or PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Mass properties are fundamental integral properties that are required for analyzing static and dynamic behaviors of objects. Most design systems provide the capabilities to compute an object's mass (weight), center of mass, and moments of inertia. Conventional manufacturing techniques such as machining, casting, molding, etc., typically allow creating an object either with a single homogeneous material or as an assembly of components each with homogeneous materials.

Figure 2A:
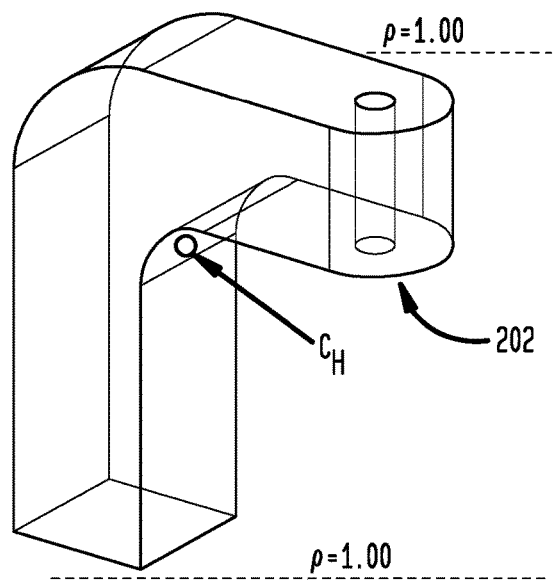
FIGS. 2A and 2B illustrate an example of designing a material distribution in order to improve the stability of a mechanical part.
Figure 2B:
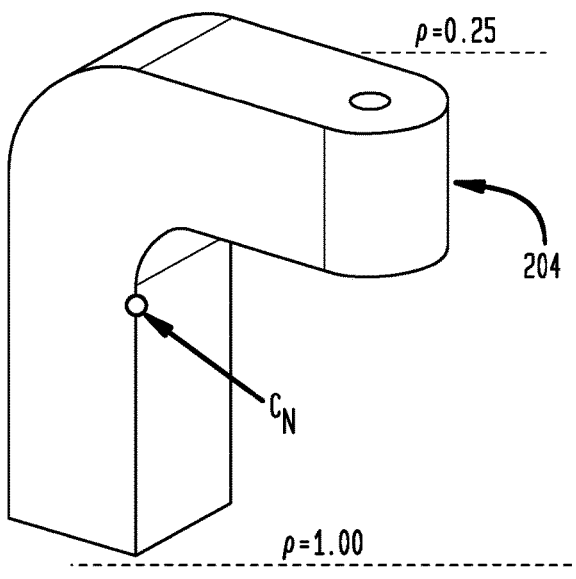

FIGS. 2A and 2B illustrate an example of designing a material distribution in order to improve the stability of a mechanical part. In FIG. 2A, the part shown as object 202 is designed with a homogeneous material. The part will topple when placed in the upright position as shown due to the location of its center of mass, designated $C_H$. In FIG. 2B, the material density of the part shown as object 204 is designed to increase from top to bottom so that the part's center of mass is lowered, designated $C_N$. Light-weighting is a common theme in the aerospace, energy, and automotive industries to leverage the benefits of advanced materials and manufacturing technology. This implies that computation of mass and weight are important calculations driving such product design themes.

Existing techniques in the literature for computing mass properties assume that solids are made of homogeneous materials (i.e., constant density). It is common practice to create a part as an assembly of solids, each component having a homogeneous material distribution. Mass properties of such parts are determined by computing the mass properties of each individual component in the assembly and aggregating them.

Disclosed embodiments include a method for computing integral mass properties of objects with continuously varying material density distributions. This provides a significant technical advantage in supporting design workflows geared towards additive manufacturing and any other fabrication methods that enable non-homogeneous material distributions. Specifically, the disclosed techniques include computations of the object's mass, center of mass, and moments of inertia, which are the most commonly used mass properties in computer-aided design (CAD) systems. Even though the volume of an object is independent of the material density distribution, a discussion of volume is included herein for completeness. Other mass properties such as products of inertia and higher order moments can also be addressed using the methodology disclosed herein.

Disclosed embodiments incorporate and extend domain decomposition methods to take advantage of computational efficiency compared to other approaches.

A disclosed method first tessellates a modeled object's surface into a set of triangles. Then, using a central projection technique, a reference point is used in conjunction with the triangles to create tetrahedrons. The material density function within the tetrahedron is approximated with a trilinear function. Closed form expressions are used to compute mass properties of a tetrahedron with linearly varying material density. These expressions are used to compute the mass properties of the object by aggregating individual mass properties of the tetrahedrons. In order to reduce any approximation error due to the linear approximation of the density function, the tetrahedrons are recursively split into a number of smaller tetrahedrons until a tolerance condition is met and their individual mass properties are then aggregated. Disclosed embodiments also include techniques to estimate the approximation error due to the surface tessellation as well as due to the linear approximation of the material density function.

For purposes of this description, definitions of commonly used integral mass properties in computer-aided design including volume, mass, center of mass, and moments of inertia are as follows.

Let $S \subset R^3$ be a modeled object, solid or otherwise. Let $\rho(x, y, z)$ be the non-homogeneously varying density of the object defined over the entire volume of S. The mass properties of S are defined as follows:

$$\text{Volume:} v = \iiint_S dxdydz \quad (1.1)$$

$$\text{Mass:} m = \iiint_S \rho dxdydz \quad (1.2)$$

Let $C=(x_C, y_C, z_C)$ be the center of mass S.

$$\text{Center of mass: } C = \frac{1}{m}\left(\iiint_S x\rho dxdydz, \iiint_S y\rho dxdydz, \iiint_S z\rho dxdydz\right) \quad (1.3)$$

The term $\iiint_S$ is used to denote the volume integral over the region covered by the object S. The inertia tensor I about the origin of the coordinate system O is given by $$I^O = \begin{bmatrix} I_{xx}^O & -I_{xy}^O & -I_{xz}^O \\ -I_{yx}^O & I_{yy}^O & -I_{yz}^O \\ -I_{zx}^O & -I_{zy}^O & I_{zz}^O \end{bmatrix} \quad (1.4)$$

Where $$I_{xx}^O = \iiint_S (y^2+z^2)\rho dxdydz$$

$$I_{yy}^O = \iiint_S (z^2+x^2)\rho dxdydz$$

$$I_{zz}^O = \iiint_S (x^2+y^2)\rho dxdydz$$

$$I_{xy}^O = I_{yx}^O = \iiint_S xy\rho dxdydz$$

$$I_{xz}^O = I_{zx}^O = \iiint_S xz\rho dxdydz$$

$$I_{yz}^O = I_{zy}^O = \iiint_S yz\rho dxdydz \quad (1.5)$$

The inertia tensor about the center of mass C is related to the $I^O$ by the parallel axis theorem:

$$I^O = I^C + m(\|d_{C,O}\|^2 E - d_{C,O} d^t_{C,O})$$

$$d_{C,O} = C - O \quad (1.6)$$

where E is the 3×3 identity matrix.

In Equations (1.2), (1.3), and (1.5), note that the density $\rho$ is a function of the spatial variables, and therefore has to be computed as part of the integrand. In other cases, the density function is constant and can be factored out of the integrand, thereby simplifying the computation of the mass properties.

Disclosed techniques use closed form expressions for computing mass properties of a tetrahedron with material density varying linearly across its volume. These expressions are then used to compute the mass properties of an object S.

To determine the mass properties of a tetrahedron, the system evaluates the integrals in equations (1.2), (1.3), and (1.5). There are many existing numerical methods for approximating these sorts of integrals. For a survey, see, for example, "An Encyclopaedia of Cubature Formulas," J. Complexity, 19: 445-453, 2003, incorporated herein by reference. Rather than use these methods, the system can use exact closed-form formulae for integrals involving linearly-varying density functions. Given these formulae, the integrals in (1.2), (1.3), and (1.5) can be computed via a subdivision process. This allows better understanding and control of approximation errors.

To determine the mass properties of a tetrahedron with linearly varying density, let $Q=(x_Q, y_Q, z_Q)$, $A=(x_A, y_A, z_A)$, $B=(x_B, y_B, z_B)$, $C=(x_C, y_C, z_C)$ be the vertices of a tetrahedron T Let $\rho_Q$, $\rho_A$, $\rho_B$, $\rho_C$, respectively be the material densities at the vertices. Assume that the density varies linearly over T. Let $U=A-Q=(x_U, y_U, z_U)$, $V=B-Q=(x_V, y_V, z_V)$, $W=C-Q=(x_W, y_W, z_W)$.

Figure 3:
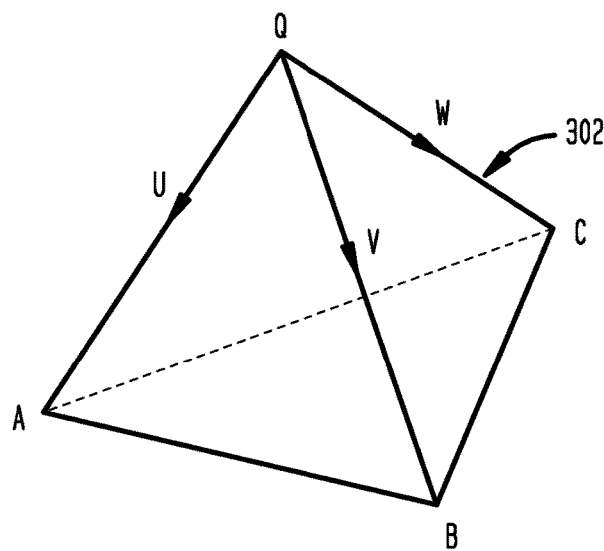
FIG. 3 illustrates a tetrahedron in accordance with disclosed embodiments.

FIG. 3 illustrates a tetrahedron 300 with vertices Q, A, B, C. Let $$\tau = \begin{bmatrix} x_U & x_V & x_W \\ y_U & y_V & y_W \\ z_U & z_V & z_W \end{bmatrix} \quad (1.7)$$

$$\|\tau\| = \langle U, V \times W \rangle \quad (1.8)$$

Consider the tetrahedron T' formed by the origin O and U,V,W as a translated version of T. Let $\overline{T}$ be the tetrahedron with vertices $\overline{Q}=(0, 0, 0)$, $\overline{A}=(1, 0, 0)$, $\overline{B}=(0, 1, 0)$, $\overline{C}=(0, 0, 1)$. The coordinates of T' and $\overline{T}$ are related as $$\begin{bmatrix} x \\ y \\ z \end{bmatrix} = \tau \begin{bmatrix} \overline{x} \\ \overline{y} \\ \overline{z} \end{bmatrix} \quad (1.9)$$

Let $\iiint_{\overline{T}} f(\overline{x}, \overline{y}, \overline{z}) d\overline{x} d\overline{y} d\overline{z} = \int_0^1 \int_0^{1-\overline{z}} \int_0^{1-\overline{z}-\overline{y}} f(\overline{x}, \overline{y}, \overline{z}) d\overline{x} d\overline{y} d\overline{z}$ denote the integral of $f(\overline{x}, \overline{y}, \overline{z})$ over the tetrahedron $\overline{T}$.

The volume of the tetrahedron T is $$v_T = \iiint_T dxdydz = \|\tau\| \iiint_{\overline{T}} d\overline{x} d\overline{y} d\overline{z} = \frac{\|\tau\|}{6} \quad (1.10)$$

To determine the mass of the tetrahedron, let P be a point inside the tetrahedron T with barycentric coordinates $\alpha$, $\beta$, $\gamma$, $\delta$. $\overline{P}$ is the point inside the tetrahedron $\overline{T}$ that corresponds to point P inside the tetrahedron T.

$$\rho_P = \alpha \rho_Q + \beta \rho_A + \gamma \rho_B + \delta \rho_C = (1-\beta-\gamma-\delta)\rho_Q + \beta \rho_A + \gamma \rho_B + \delta \rho_C \quad (1.11)$$

$$m_T = \iiint_T \rho_P dxdydz = \|\tau\| \iiint_{\overline{T}} \rho_{\overline{P}} d\overline{x} d\overline{y} d\overline{z} \quad (1.12)$$

Since barycentric coordinates are preserved under affine transformations, $$m_T = \|\tau\| \iiint_{\overline{T}} ((1-\overline{x}-\overline{z}-\overline{y})\rho_Q + \overline{x}\rho_A + \overline{y}\rho_B + \overline{z}\rho_C) d\overline{x} d\overline{y} d\overline{z} = \frac{\|\tau\|(\rho_Q + \rho_A + \rho_B + \rho_C)}{24} = v_T \frac{(\rho_Q + \rho_A + \rho_B + \rho_C)}{4} \quad (1.13)$$

For the center of mass of the tetrahedron, let $$\rho_{avg} = \frac{(\rho_Q + \rho_A + \rho_B + \rho_C)}{4}.$$

Let $C_{T'} = (x_{C,T'}, y_{C,T'}, z_{C,T'})$ be the center of mass T'.

$$x_{C,T'} = \frac{1}{m_T} \iiint_T x\rho_P dxdydz = \frac{\|\tau\|}{m_T} \iiint_{\overline{T}} x_U \overline{x} + x_V \overline{y} + x_W \overline{z} + \\ ((1-\overline{x}-\overline{z}-\overline{y})\rho_Q + \overline{x}\rho_A + \overline{y}\rho_B + \overline{z}\rho_C) d\overline{x} d\overline{y} d\overline{z} = \\ \frac{x_U(4\rho_{avg} + \rho_A) + x_V(4\rho_{avg} + \rho_B) + x_W(4\rho_{avg} + \rho_C)}{20\rho_{avg}} \quad (1.14)$$

Similarly, $$y_{C,T'} = \frac{y_U(4\rho_{avg} + \rho_A) + y_V(4\rho_{avg} + \rho_B) + y_W(4\rho_{avg} + \rho_C)}{20\rho_{avg}} \quad (1.15)$$

$$z_{C,T'} = \frac{z_U(4\rho_{avg} + \rho_A) + z_V(4\rho_{avg} + \rho_B) + z_W(4\rho_{avg} + \rho_C)}{20\rho_{avg}}$$

The center of mass of T is related to the center of mass of T' as $$C_T = C_{T'} + Q. \quad (1.16)$$

In order to compute the moment of inertia, there are six unique integrals, $I_{i,T}$, $i=1 \ldots 6$ to be evaluated. The moments of inertia of T and T' are related according to the parallel axis theorem.

$$I_{1,T'} = \iiint_{T'} x^2 \rho dxdydz = \quad (1.17)$$
$$\|\tau\| \iiint_{\overline{T}} (x_U \overline{x} + x_V \overline{y} + x_W \overline{z})^2 ((1-\overline{x}-\overline{z}-\overline{y})\rho_Q + \\ \overline{x}\rho_A + \overline{y}\rho_B + \overline{z}\rho_C) d\overline{x} d\overline{y} d\overline{z} = \\ \frac{\|\tau\|}{360} \{(4\rho_{avg} + 2\rho_A)x_U^2 + (4\rho_{avg} + 2\rho_B)x_V^2 + \\ (4\rho_{avg} + 2\rho_C)x_W^2 + (4\rho_{avg} + \rho_A + \rho_B)x_U x_V + \\ (4\rho_{avg} + \rho_B + \rho_C)x_V x_W + (4\rho_{avg} + \rho_C + \rho_A)x_W x_U\}$$

$$I_{1,T} = I_{1,T'} + m_T(2x_Q x_{C,T'} + x_Q^2) \quad (1.18)$$

$$I_{2,T'} = \iiint_{T'} y^2 \rho dxdydz = \quad (1.19)$$
$$\|\tau\| \iiint_{\overline{T}} (y_U \overline{x} + y_V \overline{y} + y_W \overline{z})^2 ((1-\overline{x}-\overline{z}-\overline{y})\rho_Q + \\ \overline{x}\rho_A + \overline{y}\rho_B + \overline{z}\rho_C) d\overline{x} d\overline{y} d\overline{z} = \\ \frac{\|\tau\|}{360} \{(4\rho_{avg} + 2\rho_A)y_U^2 + (4\rho_{avg} + 2\rho_B)y_V^2 + \\ (4\rho_{avg} + 2\rho_C)y_W^2 + (4\rho_{avg} + \rho_A + \rho_B)y_U y_V + \\ (4\rho_{avg} + \rho_B + \rho_C)y_V y_W + (4\rho_{avg} + \rho_C + \rho_A)y_W y_U\}$$

$$I_{2,T} = I_{2,T'} + m_T(2y_Q y_{C,T'} + y_Q^2) \quad (1.20)$$

$$I_{3,T'} = \iiint_{T'} z^2 \rho dxdydz = \quad (1.21)$$
$$\|\tau\| \iiint_{\overline{T}} (z_U \overline{x} + z_V \overline{y} + z_W \overline{z})^2 ((1-\overline{x}-\overline{z}-\overline{y})\rho_Q + \\ \overline{x}\rho_A + \overline{y}\rho_B + \overline{z}\rho_C) d\overline{x} d\overline{y} d\overline{z} = \\ \frac{\|\tau\|}{360} \{(4\rho_{avg} + 2\rho_A)z_U^2 + (4\rho_{avg} + 2\rho_B)z_V^2 + \\ (4\rho_{avg} + 2\rho_C)z_W^2 + (4\rho_{avg} + \rho_A + \rho_B)z_U z_V + \\ (4\rho_{avg} + \rho_B + \rho_C)z_V z_W + (4\rho_{avg} + \rho_C + \rho_A)z_W z_U\}$$

$$I_{3,T} = I_{3,T'} + m_T(2z_Q z_{C,T'} + z_Q^2) \quad (1.22)$$

$$I_{4,T'} = \iiint_{T'} xy\rho dxdydz = \quad (1.23)$$
$$\|\tau\| \iiint_{\overline{T}} (x_U \overline{x} + x_V \overline{y} + x_W \overline{z})(y_U \overline{x} + y_V \overline{y} + y_W \overline{z}) \\ ((1-\overline{x}-\overline{z}-\overline{y})\rho_Q + \overline{x}\rho_A + \overline{y}\rho_B + \overline{z}\rho_C) d\overline{x} d\overline{y} d\overline{z} = \\ \frac{\|\tau\|}{360} \{(4\rho_{avg} + 2\rho_A)x_U y_U + (4\rho_{avg} + 2\rho_B)x_V y_V + \\ (4\rho_{avg} + 2\rho_C)x_W y_W + (4\rho_{avg} + \rho_A + \rho_B)x_U y_V + \\ (4\rho_{avg} + \rho_B + \rho_C)x_V y_W + (4\rho_{avg} + \rho_C + \rho_A)x_W y_U\}$$

$$I_{4,T} = I_{4,T'} + m_T(x_Q x_{C,T'} + y_Q y_{C,T'} + x_Q y_Q) \quad (1.24)$$

$$I_{5,T'} = \iiint_{T'} yz\rho dxdydz = \quad (1.25)$$
$$\|\tau\| \iiint_{\overline{T}} (y_U \overline{x} + y_V \overline{y} + y_W \overline{z})(z_U \overline{x} + z_V \overline{y} + z_W \overline{z}) \\ ((1-\overline{x}-\overline{z}-\overline{y})\rho_Q + \overline{x}\rho_A + \overline{y}\rho_B + \overline{z}\rho_C) d\overline{x} d\overline{y} d\overline{z} = \\ \frac{\|\tau\|}{360} \{(4\rho_{avg} + 2\rho_A)y_U z_U + (4\rho_{avg} + 2\rho_B)y_V z_V + \\ (4\rho_{avg} + 2\rho_C)y_W z_W + (4\rho_{avg} + \rho_A + \rho_B)y_U z_V + \\ (4\rho_{avg} + \rho_B + \rho_C)y_V z_W + (4\rho_{avg} + \rho_C + \rho_A)y_W z_U\}$$

$$I_{5,T} = I_{5,T'} + m_T(y_Q z_{C,T'} + z_Q y_{C,T'} + y_Q z_Q) \quad (1.26)$$

-continued $$I_{6,T'} = \iiint_{T'} zx\rho dxdydz = \qquad (1.27)$$

$$\|\tau\| \iiint_T (z_U \bar{x} + z_V \bar{y} + z_W \bar{z})(x_U \bar{x} + x_V \bar{y} + x_W \bar{z})$$

$$((1 - \bar{x} - \bar{z} - \bar{y})\rho_Q + \bar{x}\rho_A + \bar{y}\rho_B + \bar{z}\rho_C) d\bar{x} d\bar{y} d\bar{z} =$$

$$\frac{\|\tau\|}{360} \{(4\rho_{avg} + 2\rho_A)x_U x_U + (4\rho_{avg} + 2\rho_B)z_V x_V +$$

$$(4\rho_{avg} + 2\rho_C)z_W x_W + (4\rho_{avg} + \rho_A + \rho_B)z_U x_V +$$

$$(4\rho_{avg} + \rho_B + \rho_C)z_V x_W + (4\rho_{avg} + \rho_C + \rho_A)z_W x_U\}$$

$$I_{6,T} = I_{6,T'} + m_T (z_Q x_{C,T'} + x_Q z_{C,T'} + z_Q x_Q) \qquad (1.28)$$

Figure 4:
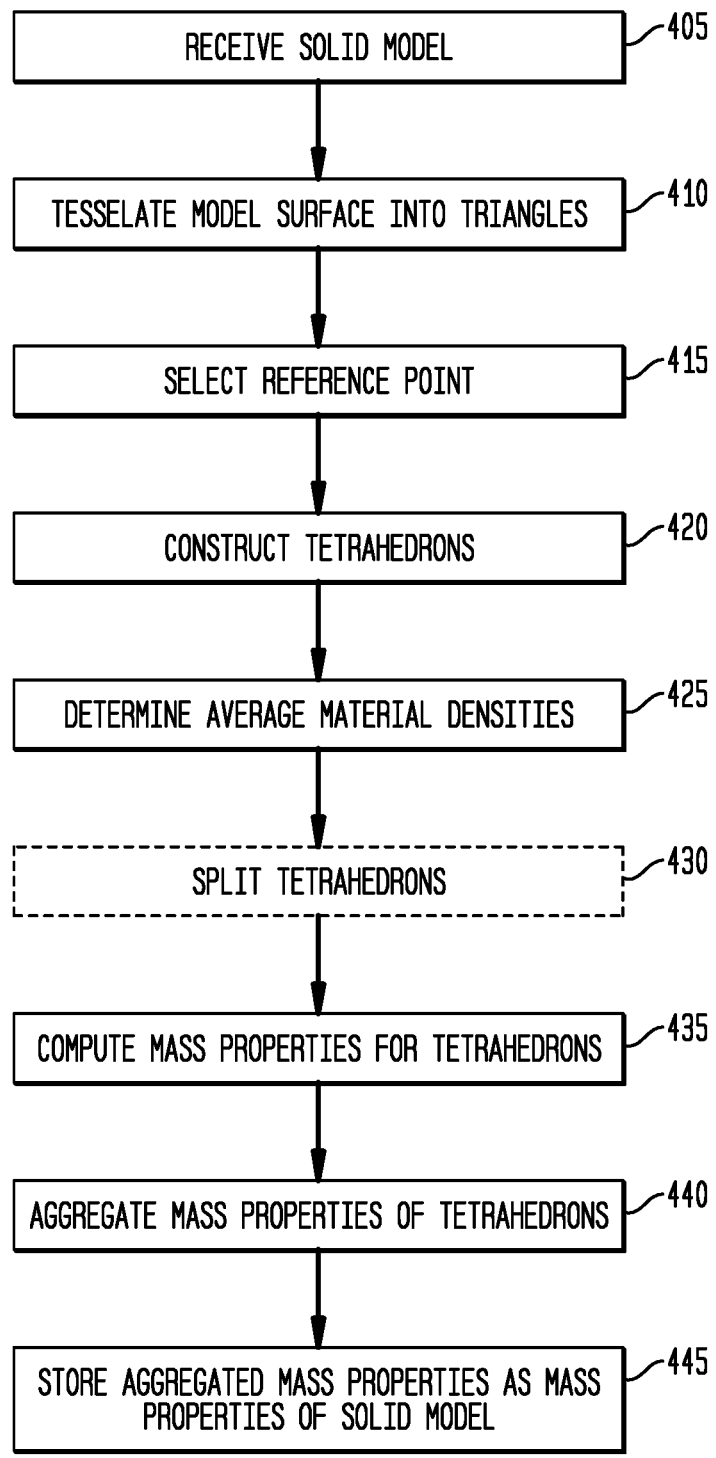
FIG. 4 illustrates a flowchart of a process in accordance with disclosed embodiments.

The system can then computer the mass properties of an arbitrary object S using the closed form expressions for the mass properties of a tetrahedron using a process as in FIG. 4.

FIG. 4 depicts a flowchart of a process in accordance with disclosed embodiments that may be performed, for example, by a data processing system such as a PLM, PDM, or CAD system, referred to generically as the "system" below.

The system receives on object S having a surface (405); the object can be a solid model or otherwise. The object S represents an object to be created with a non-homogeneous material density distribution, and so the object is considered to have a non-homogenous density. Note that "solid model" does not imply that the entire model is "solid," but rather refers to a three-dimensional model with solid portions that represents a three-dimensional object or assembly. Likewise, the surface can include multiple surfaces of the features of the model.

Figure 5:
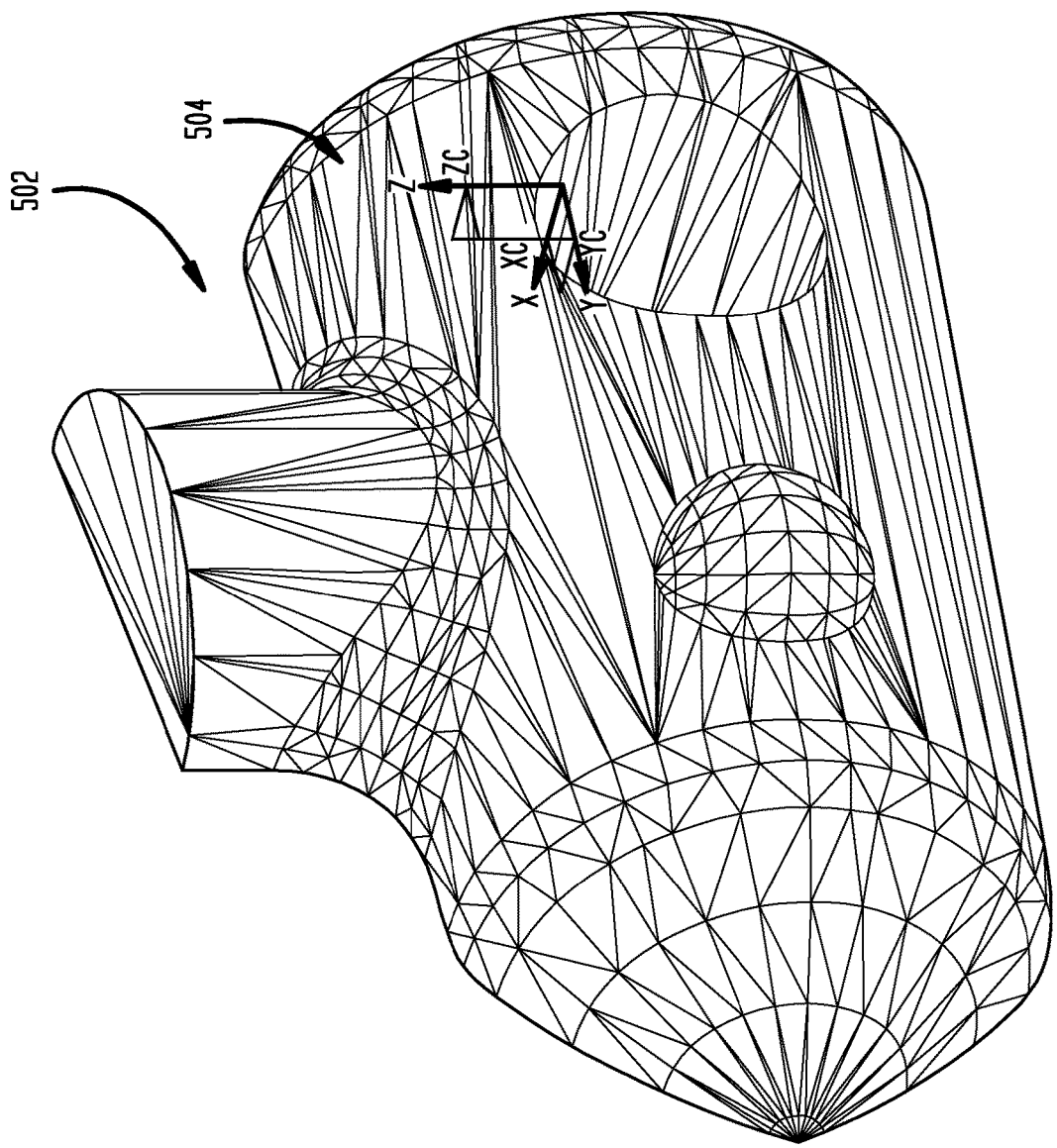
FIG. 5 illustrates an example of a modeled object in accordance with disclosed embodiments

FIG. 5 illustrates an example of a modeled object 502 in accordance with disclosed embodiments.

The system tessellates the surface of the object S into a set of triangles (410). Each triangle defined by having triangle vertices $A^{[i]} B^{[i]} C^{[i]}$. FIG. 5 illustrates triangles 504 on the surface of object 502 after tessellation.

The system selects a reference point Q for the object S (415). Q can be, for example, the origin of the coordinate system.

For each triangle in the tessellation:

The system constructs a tetrahedron $T^{[i]}$ having vertices $QA^{[i]} B^{[i]} C^{[i]}$ (420). That is, the tetrahedron is defined by tetrahedron vertices that include the vertices of the corresponding triangle and the reference point.

The system determines the material density at each of the vertices (425). In some cases, the system can use the average of the material density at each of the vertices. In other cases, points within the tetrahedron that are not necessarily the vertices can be used to compute function values (e.g., material density values).

The system can split a tetrahedron that has a parameter that exceeds a predetermined threshold into multiple smaller tetrahedrons and use the aggregated mass properties of the smaller tetrahedrons as the mass properties of the split tetrahedron (430). The parameter can be, for example, the length of edges of the tetrahedron connecting two vertices as compared to a length threshold, or can be a percentage difference between an average density of the tetrahedron and a density at a centroid of the tetrahedron is higher than a density threshold.

To split a tetrahedron into 8 smaller ones $T_j$ with vertices $Q_j, A_j, B_j, C_j, j=1 \ldots 8$, the system splits the edges of the tetrahedron. The system recursively performs steps 420-430 on each of the smaller tetrahedrons $T_j$. The system aggregates the mass properties of the smaller tetrahedrons $T_j$ using $$v_T = \sum_{j=1}^{8} v_{T_j} \qquad (1.29)$$

$$m_T = \sum_{j=1}^{8} m_{T_j}$$

$$C_T = \frac{\sum_{j=1}^{8} m_{T_j} C_{T_j}}{m_T}$$

$$I_T = \sum_{j=1}^{8} I_{T_j}$$

The system computes mass properties for each tetrahedron as described above, using the material density at each of the tetrahedron vertices (435). As described above, in some cases, the system can also calculate the average of the material density at each of the tetrahedron vertices. The mass properties include one or more of volume, mass, center of mass, and moment of inertia.

Once all triangles/tetrahedrons are processed, the system aggregates the mass properties of the tetrahedrons $T^{[i]}$ (440).

The system stores the aggregated mass properties for the tetrahedrons as the mass properties of the object S (445).

Disclosed embodiments include three sources of potential approximation error: surface tessellation, density function approximation, and numerical precision in computations.

To address surface tessellation approximation errors, the system can extrude each triangle by an amount equal to the maximum distance of a point on the triangle to the surface, and along a direction towards the surface. The system can then compute the mass properties of the prismatic solid created by the extrusion. The system can then aggregate the mass properties of the prismatic solids for each of the triangles.

To address density function approximation errors, let $$\rho = a_1 x^2 + a_2 y^2 + a_3 z^2 + b_1 xy + b_2 yz + b_3 zx + c_1 x + c_2 y + c_3 z + d$$

be the designing quadratic material density function, and $\rho_L = c_{1,L} x + c_{2,L} y + c_{3,L} z + d_L$ be its linear approximation. The error in computing the mass of the tetrahedron with linear density approximation, according to disclosed embodiments, is $$m_T = \iiint_T \rho dxdydz - \iiint_T \rho_L dxdydz \qquad (1.30)$$

$$= \iiint_T (\rho - \rho_L) dxdydz$$

$$= \iiint_T \{a_1 x^2 + a_2 y^2 + a_3 z^2 + b_1 xy + b_2 yz + b_3 zx +$$

$$(c_1 - c_{1,L})x + (c_2 - c_{2,L})y + (c_3 - c_{3,L})z + (d - d_L)\}$$

$$dxdydz$$

Similarly, closed form expressions for estimating errors due to linear approximation of density can be derived for other mass properties. Furthermore, closed form expressions can be derived for estimating errors for higher order density functions (e.g., cubic).

The processes described herein can determine mass properties of solids and other modeled objects with non-homogeneous materials as opposed to homogeneous materials. Disclosed techniques use a surface tessellation to construct a collection of tetrahedrons, and the mass properties of these tetrahedrons can be aggregated to obtain the mass properties of the object.

The tetrahedrons are not required to have uniform density, but instead can have varying density, whether linear variation or otherwise, and disclosed techniques can use closed-form formulae for properties like mass and moments of inertia.

The tetrahedrons can be subdivided to account for variations in density. The subdivision ensures that the piecewise linear density variation is a good approximation of the original density function. The use of tetrahedrons is much faster, more efficient, and accurate than using shapes such as cubes.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

Existing techniques for computing mass properties of objects assume that the material density is constant throughout the object. Several approaches have been published based on direct domain integration methods using Divergence theorem, domain decomposition (usually into tetrahedrons) and integration on transformations of sub-domains. Other techniques do not provide the advantages of the processes described herein. Various related considerations are described in the following papers, incorporated herein by reference:

Brian Mirtich, "Fast and Accurate Computation of Polyhedral Mass Properties," Journal of Graphics Tools, volume 1, number 2, 1996.

David Eberly, "Polyhedral Mass Properties (Revisited)." 2009, available at time of filing from www.geometrictools.com/Documentation/PolyhedralMassProperties.pdf.

DiCarlo, Antonio, and Alberto Paoluzzi. "Fast computation of inertia through affinely extended Euler tensor." Computer-Aided Design 38, no. 11 (2006): 1145-1153.

Michael Kallay, "Computing the Moment of Inertia of a Solid Defined by a Triangle Mesh." Journal of Graphics Tools, volume 11, number 2, 51-57 (2006).

Lien, Sheue-ling, and James T. Kajiya. "A symbolic method for calculating the integral properties of arbitrary nonconvex polyhedra." IEEE Computer Graphics and Applications 4, no. 10 (1984): 35-42.

Lee, Yong Tsui, and Aristides A G Requicha. "Algorithms for computing the volume and other integral properties of solids. I. Known methods and open issues." Communications of the ACM 25, no. 9 (1982): 635-641.

Lee, Yong Tsui, and Aristides A G Requicha. "Algorithms for computing the volume and other integral properties of solids. II. A family of algorithms based on representation conversion and cellular approximation." Communications of the ACM 25, no. 9 (1982): 642-650.

Variants of the above approaches are can be implemented in computer aided design systems and geometry kernels such as the Parasolid® software product by Siemens Product Lifecycle Management Software Inc. (Plano, Tex., USA).

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle.

What is claimed is:
1. A method comprising:
   by a data processing system:
      receiving a modeled object with a surface and a non-homogeneous density distribution;
      tessellating the surface of the modeled object into a set of triangles, each triangle defined by triangle vertices;
      selecting a reference point for the modeled object;
      constructing a tetrahedron set from the set of triangles, including by, for a given triangle of the set of triangles:
         constructing a given tetrahedron, the given tetrahedron defined by tetrahedron vertices that include the triangle vertices of given triangle and the reference point; and
         responsive to a determination that a percentage difference between an average density of the given tetrahedron and a density at a centroid of the given tetrahedron exceeds a density threshold:
            further splitting the given tetrahedron into multiple smaller tetrahedrons; and
      computing a mass property for each tetrahedron of the tetrahedron set using material densities of the tetrahedron vertices of the tetrahedrons of the tetrahedron set;
      aggregating the mass properties computed for tetrahedrons of the tetrahedron set;
      storing the aggregated mass properties of the tetrahedron set as a computed mass property of the modeled object; and providing the computed mass property of the modeled object for use in manufacturing a physical object by an additive manufacturing process according to the modeled object.

2. The method of claim 1, comprising splitting the given tetrahedron eight smaller tetrahedrons along edges of the given tetrahedron that connect the tetrahedron vertices of the given tetrahedron.

3. The method of claim 1, wherein the mass property comprises volume, mass, center of mass, or moments of inertia.

4. The method of claim 1, wherein the reference point comprises an origin of a coordinate system that the modeled object is modeled in.

5. The method of claim 1, comprising computing the mass property of each tetrahedron using a closed-form formula for the mass property with integrals with a linearly-varying density function.

6. A system comprising:
a processor; and
a non-transitory machine-readable medium comprising instructions that, when executed, cause the system to:
receive a modeled object with a surface and a non-homogeneous density distribution;
tessellate the surface of the modeled object into a set of triangles, each triangle defined by triangle vertices;
select a reference point for the modeled object;
construct a tetrahedron set from the set of triangles, including by, for a given triangle of the set of triangles:
construct a given tetrahedron, the given tetrahedron defined by tetrahedron vertices that include the triangle vertices of given triangle and the reference point; and
responsive to a determination that a percentage difference between an average density of the given tetrahedron and a density at a centroid of the given tetrahedron exceeds a density threshold:
further split the given tetrahedron into multiple smaller tetrahedrons; and
compute a mass property for each tetrahedron of the tetrahedron set using material densities of the tetrahedron vertices of the tetrahedrons of the tetrahedron set;
aggregate the mass properties computed for tetrahedrons of the tetrahedron set;
store the aggregated mass properties of the tetrahedron set as a computed mass property of the modeled object; and
provide the computed mass property of the modeled object for use in manufacturing a physical object by an additive manufacturing process according to the modeled object.

7. The system of claim 6, wherein the instructions, when executed, cause the system to split the given tetrahedron eight smaller tetrahedrons along edges of the given tetrahedron that connect the tetrahedron vertices of the given tetrahedron.

8. The system of claim 6, wherein the mass property comprises volume, mass, center of mass, or moments of inertia.

9. The system of claim 6, wherein the reference point comprises an origin of a coordinate system that the modeled object is modeled in.

10. The system of claim 6, wherein the instructions, when executed, cause the system to compute the mass property of each tetrahedron using a closed-form formula for the mass property with integrals with a linearly-varying density function.

11. A non-transitory machine-readable medium comprising instructions that, when executed by a processor, cause a computing system to:
receive a modeled object with a surface and a non-homogeneous density distribution;
tessellate the surface of the modeled object into a set of triangles, each triangle defined by triangle vertices;
select a reference point for the modeled object;
construct a tetrahedron set from the set of triangles, including by, for a given triangle of the set of triangles:
construct a given tetrahedron, the given tetrahedron defined by tetrahedron vertices that include the triangle vertices of given triangle and the reference point; and
responsive to a determination that a length of an edge of the given tetrahedron that connects two vertices of the given tetrahedron exceeds a length threshold:
further split the given tetrahedron into multiple smaller tetrahedrons; and
compute a mass property for each tetrahedron of the tetrahedron set using material densities of the tetrahedron vertices of the tetrahedrons of the tetrahedron set;
aggregate the mass properties computed for tetrahedrons of the tetrahedron set;
store the aggregated mass properties of the tetrahedron set as a computed mass property of the modeled object; and
provide the computed mass property of the modeled object for use in manufacturing a physical object by an additive manufacturing process according to the modeled object.

12. The system of claim 6, wherein the instructions, when executed, cause the computing system to split the given tetrahedron eight smaller tetrahedrons along edges of the given tetrahedron that connect the tetrahedron vertices of the given tetrahedron.

13. The system of claim 6, wherein the mass property comprises volume, mass, center of mass, or moments of inertia.

14. The system of claim 6, wherein the reference point comprises an origin of a coordinate system that the modeled object is modeled in.

15. The system of claim 6, wherein the instructions, when executed, cause the computing system to compute the mass property of each tetrahedron using a closed-form formula for the mass property with integrals with a linearly-varying density function.

* * * * *